United States Patent [19]
Lee

[11] Patent Number: 5,825,331
[45] Date of Patent: Oct. 20, 1998

[54] RADIATED EMISSION MEASURING METHOD USING GTEM CELL

[75] Inventor: Ae-Kyoung Lee, Daejeong, Rep. of Korea

[73] Assignee: Electronics and Telecommunications Research Institute, Daejeon, Rep. of Korea

[21] Appl. No.: 668,142

[22] Filed: Jun. 21, 1996

[30] Foreign Application Priority Data

Jun. 23, 1995 [KR] Rep. of Korea .................. 1995-17175

[51] Int. Cl.$^6$ ...................................................... G01R 29/08
[52] U.S. Cl. .......................................... 343/703; 455/67.2
[58] Field of Search ............................ 343/703; 342/360, 342/361; 174/35 MS; 455/67.1, 67.2

[56] References Cited

U.S. PATENT DOCUMENTS

| | | | |
|---|---|---|---|
| 4,201,987 | 5/1980 | Tricoles et al. | 343/703 |
| 4,754,496 | 6/1988 | Fishkin et al. | 343/703 |
| 4,929,960 | 5/1990 | Kaylor et al. | 343/703 |
| 5,001,494 | 3/1991 | Dorman et al. | 343/703 |
| 5,119,105 | 6/1992 | Ngai et al. | 363/703 |
| 5,365,241 | 11/1994 | Williams et al. | 343/703 |
| 5,430,456 | 7/1995 | Osburn et al. | 343/703 |

FOREIGN PATENT DOCUMENTS 9404933  3/1994  WIPO .

*Primary Examiner*—Hoanganh T. Le
*Assistant Examiner*—Tan Ho
*Attorney, Agent, or Firm*—Antonelli, Terry, Stout & Kraus, LLP

[57] ABSTRACT

A method for measuring radiated emission using a GTEM cell is disclosed in which a DUT is placed inside the GTEM cell, and its power is measured by a power receiver. The direction of the DUT is changed, and then its transmission power is measured. Here, the arrangements of the DUT are fifteen, and their power measurement number is 15. These powers measured are transmitted to a computer system through a GPIB cable, in which the powers are accepted in the form of data in order to calculate emission in OATS. Accordingly, the maximum vertical/horizontal electric field emitted from the DUT in OATS is estimated over the whole band of radiated emission test. This enables a desired emission value to be measured for a short time only utilizing the GTEM cell.

3 Claims, 17 Drawing Sheets

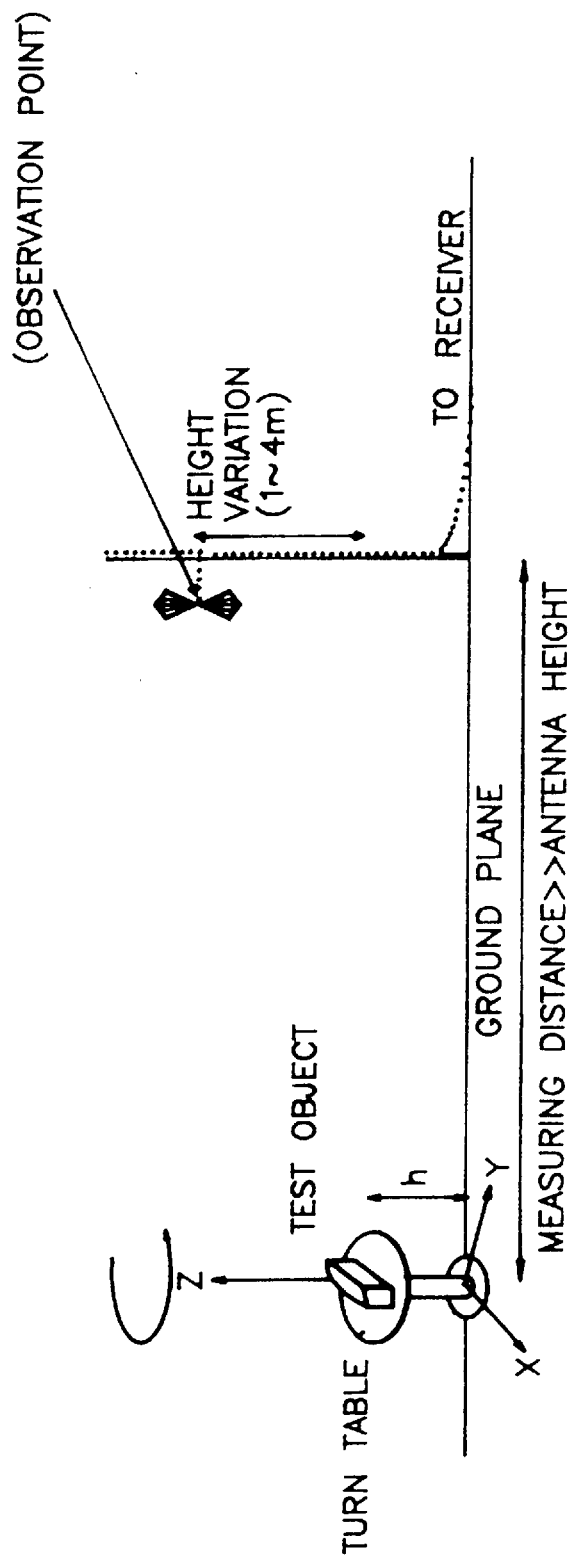

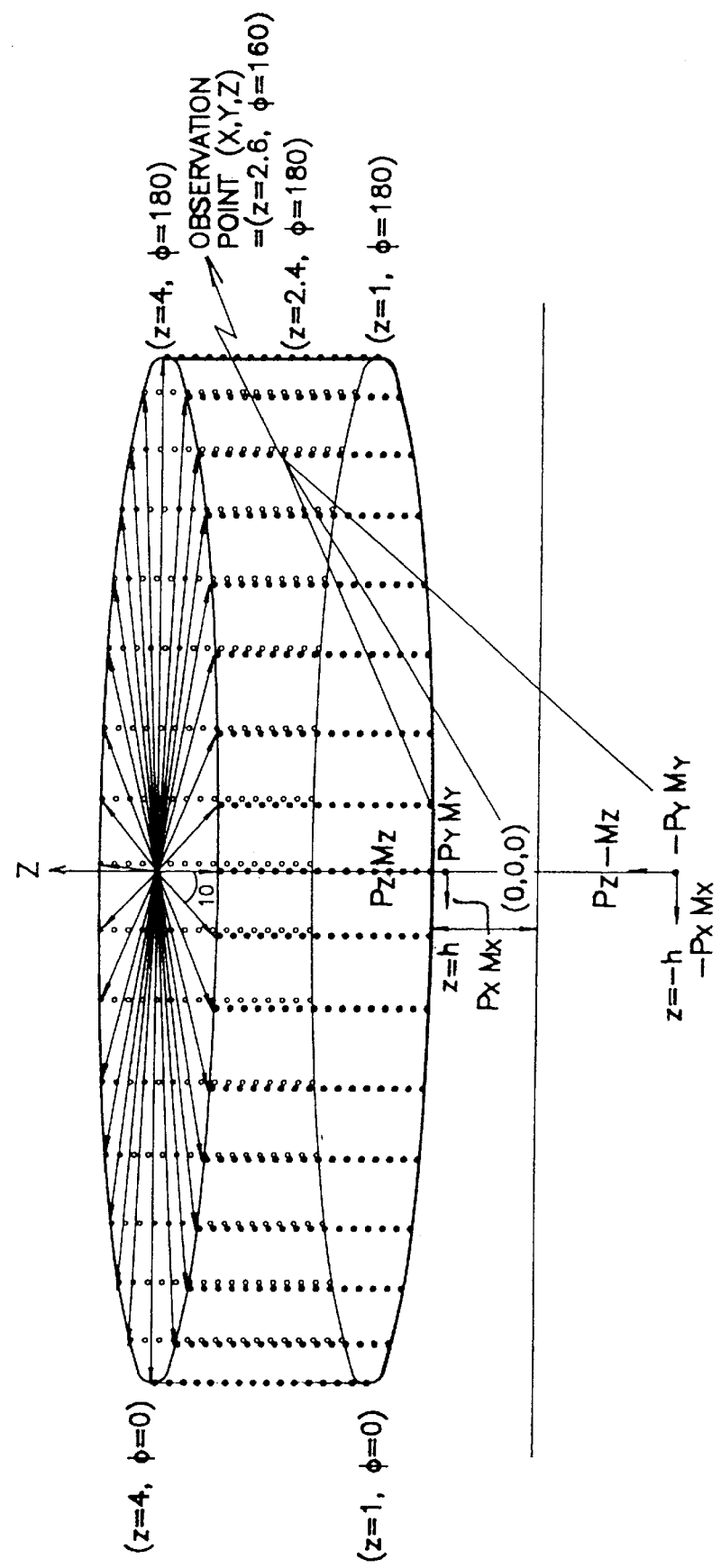

VERTICAL ELECTRIC FIELD STRENGTH

| Frequency (MHz) | GTEM data (dBuV/m) | OATS data* (dBuV/m) | Difference(dB) (GTEM−OATS) |
|---|---|---|---|
| 34.86 | 39.84 | 44.98 | −5.14 |
| 38.64 | 38.43 | 41.06 | −2.63 |
| 41.88 | 34.76 | 36.90 | −2.14 |
| 45.66 | 36.97 | 39.13 | −2.16 |
| 48.90 | 35.35 | 38.63 | −3.28 |
| 52.68 | 29.77 | 33.64 | −3.87 |
| 55.92 | 37.25 | 40.37 | −3.12 |
| 59.43 | 30.70 | 34.47 | −3.77 |
| 62.94 | 36.07 | 37.24 | −1.17 |
| 66.72 | 34.85 | 34.86 | −0.01 |
| 69.96 | 32.96 | 31.01 | −1.95 |
| 73.74 | 33.49 | 31.63 | −1.86 |
| 77.52 | 33.69 | 32.66 | −1.03 |
| 84.00 | 32.36 | 35.25 | −2.89 |
| 100.20 | 33.83 | 34.29 | −0.46 |
| 112.62 | 32.05 | 35.53 | −3.48 |
| 140.70 | 33.08 | 35.55 | −2.47 |
| 150.42 | 32.61 | 35.72 | −3.12 |
| 168.78 | 36.52 | 36.87 | −0.35 |
| 196.86 | 32.80 | 37.65 | −4.85 |
| 224.40 | 38.11 | 40.05 | −1.94 |
| 242.22 | 36.26 | 38.06 | −1.80 |
| 245.46 | 36.51 | 37.68 | −1.17 |
| 249.78 | 43.38 | 42.13 | −1.25 |
| 237.54 | 39.76 | 39.11 | −0.65 |
| 275.70 | 39.41 | 38.94 | −0.47 |
| 300.00 | 38.30 | 40.15 | −1.85 |

\* by biconical antenna : BBA 9103 in VHA 9103 Holder
(Schwartzbeck Mess−Electronik)

| Frequency (MHz) | GTEM data (dBμV/m) | OATS data # (dBμV/m) | Difference(dB) (GTEM−OATS) |
|---|---|---|---|
| 301.40 | 36.93 | 36.62 | −0.31 |
| 308.40 | 36.24 | 35.36 | −0.88 |
| 325.20 | 36.62 | 35.23 | −1.39 |
| 350.40 | 40.69 | 37.65 | −3.04 |
| 364.40 | 39.24 | 36.73 | −2.51 |
| 392.40 | 38.35 | 35.34 | −3.01 |
| 399.40 | 40.08 | 37.23 | −2.85 |
| 499.80 | 39.27 | 38.50 | −0.77 |
| 500.20 | 40.18 | 38.60 | −1.58 |
| 549.90 | 38.96 | 38.05 | −0.91 |
| 555.50 | 37.18 | 37.53 | −0.35 |
| 600.30 | 40.51 | 39.59 | −0.92 |
| 637.40 | 39.18 | 39.24 | −0.06 |
| 649.30 | 44.02 | 39.99 | −4.03 |
| 750.80 | 41.20 | 41.44 | −0.24 |
| 773.90 | 40.77 | 41.64 | −0.87 |
| 799.80 | 41.37 | 41.14 | −0.23 |
| 864.20 | 41.14 | 42.71 | −1.57 |
| 892.90 | 41.44 | 42.31 | −0.87 |
| 907.60 | 41.04 | 42.93 | −1.89 |
| 918.80 | 42.89 | 42.82 | −0.07 |
| 925.80 | 42.31 | 42.59 | −0.28 |
| 937.70 | 42.00 | 43.19 | −1.19 |
| 953.80 | 42.66 | 43.76 | −1.10 |
| 961.50 | 42.12 | 43.57 | −1.45 |
| 979.00 | 42.24 | 43.81 | −1.57 |
| 982.50 | 42.35 | 43.41 | −1.06 | by log−periodic array antenna : Model 3146(EMCO)

FIG. 11B
HORIZONTAL ELECTRIC FIELD STRENGTH

| Frequency (MHz) | GTEM data (dBµV/m) | SCA data* (dBµV/m) | Difference(dB) (GTEM−OATS) |
|---|---|---|---|
| 34.86 | 36.75 | 38.63 | −1.88 |
| 38.64 | 36.01 | 35.36 | +0.65 |
| 41.88 | 33.25 | 33.50 | −0.25 |
| 45.66 | 34.89 | 33.39 | +1.50 |
| 48.90 | 33.43 | 32.49 | +0.94 |
| 62.94 | 34.81 | 30.30 | +4.51 |
| 84.54 | 34.12 | 31.24 | +2.88 |
| 91.02 | 31.89 | 29.75 | +2.14 |
| 94.80 | 31.06 | 29.79 | +1.27 |
| 105.60 | 29.78 | 31.65 | −1.87 |
| 245.46 | 34.25 | 38.33 | −4.08 |
| 250.32 | 39.94 | 43.78 | −3.84 |

\* by biconical antenna : BBA 9103 in VHA 9103 Holder (Schwartzbeck Mess−Electronik)

| Frequency (MHz) | GTEM data (dBµV/m) | OATS data# (dBµV/m) | Difference(dB) (GTEM−OATS) |
|---|---|---|---|
| 325.20 | 34.00 | 35.83 | −1.83 |
| 350.40 | 35.09 | 36.55 | −1.46 |
| 353.20 | 34.04 | 35.30 | −1.26 |
| 363.70 | 35.40 | 36.28 | −0.88 |
| 392.40 | 36.97 | 36.69 | +0.28 |
| 399.40 | 37.32 | 37.74 | −0.42 |
| 448.40 | 38.06 | 38.87 | −0.81 |
| 500.20 | 39.57 | 39.80 | −0.23 |
| 547.80 | 38.91 | 39.61 | −0.70 |
| 601.00 | 39.08 | 39.24 | −0.16 |
| 650.70 | 39.64 | 40.08 | −0.44 |
| 700.40 | 42.99 | 41.55 | +1.44 |
| 728.40 | 39.25 | 41.39 | −2.14 |
| 770.40 | 40.11 | 41.99 | −1.88 |
| 800.50 | 40.28 | 41.55 | −1.27 |
| 841.10 | 40.72 | 42.32 | −1.60 |
| 845.30 | 40.02 | 42.45 | −2.43 |
| 848.80 | 40.32 | 42.73 | −2.41 |
| 854.40 | 40.15 | 42.59 | −2.44 |

\# by log−periodic array antenna : Model 3146(EMCO)

FIG. 12

| | | mean(μ) (dB) | standard deviation(σ) (dB) | Pearson's r |
|---|---|---|---|---|
| Vertical Component | 30–30MHz | −1.65 | 1.98 | 0.81 |
| | 300–1000MHz | +0.37 | 1.63 | 0.89 |
| Horizontal Component | 30–30MHz | +1.64 | 2.64 | 0.82 |
| | 300–1000MHz | −1.09 | 1.03 | 0.90 |

RADIATED EMISSION MEASURING METHOD USING GTEM CELL

BACKGROUND OF THE INVENTION

1. Field of the Invention

The present invention relates to a radiated emission measuring method for a GTEM cell, whereby the method is designed to obtain the correlation between a facility with a ground plane (GP) as an open area test site (OATS) or semi-anechoic chamber (SAC) and a GTEM (Giga-hertz Transverse ElectroMagnetic) cell, one of the substitute test facilities of GP which is utilized for measuring radiated emission generated from electronic products due to their clock oscillation, etc.

2. Description of the Prior Art

Recently, there has been increasing interest in harmful electromagnetic waves generated from electron products (for instance, TV, computer, etc). For this reason, in nations making electronic products, there is performed EMI (ElectroMagnetic Interference) testing in order to produce goods suitable to acceptable EMI standards.

According to these EMI standards, OATS or SAC are recommended for radiated emission testing, as shown in FIG. 1. This is to receive radiated emission from a device under testing (DUT) 1 mounted on a turntable 2 via a receiving antenna 3 in a site having low exposure to environmental noises so that interference by outer electromagnetic waves is eliminated. Here, a power receiver 4 accepts the DUT's emission power via receiving antenna 3. Such radiated emission test using OATS is performed on the ground basically. The height of DUT 1 and the position of receiving antenna 3 are fixed, and then turntable 2 is rotated on which DUT 1 is put, at the respective frequency points. After turntable 2 is rotated by 360°, the height of receiving antenna 3 is changed, and then turntable 2 is rotated again by 360°.

While varying the height of receiving antenna 3 from 1 m to 4 m, such operation is performed so that the maximum electric field value that the antenna receives from DUT 1 is recorded in a computer system over the whole band of measurement frequency. However, for OATS, it is hard to choose a suitable site for the test because of the increase of artificial noise due to a variety of broadcasting or radio communications systems, as well as the increasing number of electronic or electric products which have become living necessities. In addition, OATS entails installation cost, and possibly requires frequent changes to testing plans due to any change in the weather.

In order to overcome such problems associated with OATS, semi-anechoic chamber (SAC) and TEM cells have been developed. The use of a GTEM cell has been increased recently. The GTEM cell was proposed by Dr. Hansen GmbH in the 1980's, and is regarded as having all the advantages of the conventional facilities but no particular defects.

EMI measurement using a TEM cell or a GTEM cell is to indirectly simulate or estimate EMI in OATS, by putting a DUT in the cell and thus measuring the power of the cell output stage with respect to the direction variation of the DUT according to an algorithm correlative with the OATS. This dispenses with the height change of the antenna, rotation of the DUT from 0° to 360°, or replacement of the antenna in the OATS, reducing the measurement time to about one hour.

The GTEM cell, invented by Swiss ABB Co., obtained the rights of an international patent and has been studied continuously so that at present four companies sell hardware (GTEM cell) and its software (algorithm correlative with OATS) all over the world.

The structural principle of the GTEM cell will be described below with reference to FIG. 2.

The GTEM cell consists of an outer conductor 6 tapered towards coaxial connector 5 in the form of a square cone, an inner conductor 7 installed inside of outer conductor 6, a DUT 1 placed under inner conductor 7 via an access door 9 having a shielding window 8, a distributed resistor board 10 for 5 interrupting reflection caused by the tapered termination, and an RF absorber 11.

According to such a configuration, in the low frequency band, distributed resistor board 10 operates at 50Ω, and in the high frequency band, absorber 11 attenuates incident waves as in the SAC, enabling the radiated emission testing and radiated susceptibility testing to high frequency bands.

In other words, the measurement of radiated emission using the GTEM cell is not a direct measurement by the antenna as stated above but an indirect measurement by a theoretical algorithm defining the correlation with the OATS. However, since the GTEM cell measurement is an indirect measurement by a theoretical algorithm, the reliability and accuracy of the algorithm used affects the results of the measurement directly.

In order to find out the amount of radiated emission of the DUT using the GTEM cell, there must be obtained a correlation between situations of the OATS and GTEM cell.

The correlation algorithm between the GTEM cell and OATS is implemented by modeling the DUT operating inside the GTEM cell with electric/magnetic dipoles. The radiated emission from the DUT is regarded as emission from a pair of electric/magnetic dipoles. In the US and Switzerland, studies are briskly performed in order to enhance the accuracy of the implementation of the correlation algorithm. Papers relative to the correlation algorithm using the GTEM cell are utilized as examples in the following.

The calculation of the amount of radiated emission are dealt with only in consideration with the magnitudes of the respective components of the dipoles in dipole-modeling the DUT, in papers "Simulating open area test site emission measurements based on data obtained in a novel broadband TEM cell", by P. Wilson, D. Hansen and D. Koenigstein in Proc. IEEE Nat. Symp. on Electromagn. Compat., Denver, Co., May 1989, pp. 171–177 and "On Correlating TEM Cell and OATS Emission Measurement", by the same writers, IEEE Trans. on Electromagn. Compat., vol. 37, no.1, pp 1–16, Feb. 1995.

According to the above two articles, there was caused a slight error by calculating the amount of radiated emission, considering only the supposition that the dipole components are the same phases. In those papers, calculation of emission electric field of the DUT is performed only relative to the whole emission power and spatial coordinates or considering the magnitudes of the dipole components and spatial coordinates. In the papers, the number of power measurement of the GTEM cell is 12–16, and the number of measured power input to the correlation algorithm is 12 (this case involves ab theoretical problem) or 3.

There was another conventional algorithm described in "Method and apparatus for improved correlation of electromagnetic emission test data" (application No. PCT/US93/07556, U.S. Pat. No. 94/04993. This introduces a portion for searching the maximum voltage emitted from the DUT of the GTEM cell prior to the three-input correlation algorithm, in order to enhance the accuracy of the three-input correlation algorithm in "Simulation open area test site emission measurements based on data obtained in a novel broadband TEM cell". However, this patent calculates the amount of radiated emission only in consideration of the magnitude of the dipole components, and considers only the whole emission power and spatial coordinates in order to calculate the emission electric field of the DUT.

In this technology, the number of power measurement of the GTEM cell is 12–16, and the number of measured power input to the correlation algorithm is 3. Even this patent does not have an accuracy sufficient to calculate the amount of radiated emission, preventing the amount of emission from the DUT from being estimated stably. As described above, the correlation algorithms of prior art decrease their accuracy in calculation.

SUMMARY OF THE INVENTION

The present invention deals with an algorithm of correlation with OATS for measuring the amount of radiated emission of a DUT, using a GTEM cell. In the algorithm of correlation between a GTEM cell and OATS, calculation of the direction and the number of direction changes are an EMI test procedure using the GTEM cell, and can be regarded as serial processes having the GTEM power correlating to the radiated electric field in OATS. The correlation algorithm must reduce the movement of the DUT and the number of direction changes to thereby increase the measurement accuracy with the measurement time being reduced.

In order to meet such demands, it is an object of the present invention to provide a method for measuring radiated emission of a GTEM cell in which the result of emission of the DUT conforming to that of OATS is easily obtained in the GTEM cell. According to the basic principle of emission test for the DUT of a GTEM cell, the DUT is taken as a point current source multi-pole moment when the size of the DUT is much smaller than the internal space of the cell, and multi-pole moments are obtained from output end power at a coaxial connector of a GTEM cell.

For the object of the present invention, in a method for measuring radiated emission in order to obtain the correlation between a GTEM cell and OATS which are facilities to measure the radiation emission generated from electronic products, there is provided a method for measuring radiated emission of the GTEM cell comprising the steps of: (a) rotating a DUT at predetermined angles in one direction inside the GTEM cell, to thereby measure fifteen arrangements thereof; and (b) calculating the maximum vertical/horizontal electric fields for the respective test frequency ranges, referring to GTEM transmission power data measured in said step (a).

The arrangement of said DUT is performed by the relative rotation of two respective coordinates (X', Y', Z') and (X, Y, Z) of said DUT and GTEM cells.

Here, the coordinates of said DUT may be disposed arbitrarily by a user.

The fifteen arrangements of said DUT obtained in this invention are made with five rotations with respect to the vertical axis, based upon three arrangements.

Arrangement (X-X', Y-Y', Z-Z') of said DUT is obtained by equally disposing the coordinates (X, Y, Z) of said GTEM cell and the coordinates (X', Y', Z') of said DUT.

Arrangements (X-Y', Y-Z', Z-X') and (X-Z', Y-X', Z-Y') of the DUT are obtained by rotating the coordinates (X', Y', Z') of the DUT 120° clockwise with respect to the orthogonal axis of the GTEM cell coordinates (X, Y, Z).

Arrangement (X-Z', Y-X', Z-Y') is obtained by rotating the coordinates (X', Y', Z') of the DUT 120° clockwise with respect to the orthogonal axis of the GTEM cell coordinates (X, Y, Z) in the basic arrangement (X-Y', Y-Z', Z-X') of the prior step.

The order of the fifteen arrangements of said DUT has no relation to the value resulted from the radiated emission on OATS. When the above procedure is reviewed from FIG. 4, a DUT is arranged as one of said three basic arrangements, i.e. (X-X',Y-Y', Z-Z'). After initializing(n=0, m=n+2) first and second measurement variables(n, m), the first variable (n) is increased by 1, and the power of emission is measured in accordance with the first variable. The above procedure further comprises the steps of rotating the DUT counterclockwise by 45° and 90° with respect to axis Y in order to carry out Loop1; increasing said first measurement by 1; returning to the second step; and repeatedly measuring the power of emission in accordance with the corresponding measurement variable (n). The method further comprises the steps of performing Loop1 again; estimating measurement control variables(n,m); and performing Loop2 three times. Then, with respect to each basic arrangement, performing measurement hereinabove, a radiated emission magnitude of said DUT is calculated on the three-dimensional spatial coordinates.

The measurement is performed until the number of the measurement variable becomes 15, increasing the number of power measurement by three, as compared with the prior twelve measuring method steps. Even with this fact, time to take more measurements may be ignored because merely several minutes are required for the whole time of measurement. Fifteen power measurements requires fifteen power inputs to the correlation algorithm. The latter step comprises the steps of: initializing the measurement range frequency and measuring point of radiated electric field strength; and calculating the maximum vertical and horizontal value of the radiated electric field strength from the DUT while changing the position of the measuring spatial coordinates, determined by the height of vertical direction and rotation angle. The vertical and horizontal components of electric field strength from the DUT in spatial coordinate are calculated by using the fifteen GTEM cell output end power ($P_f(1)$, $P_f(2)$, ..., $P_f(15)$), with respect to fifteen arrangements of the DUT. All of these powers can be indicated by means of the amplitude and phase of the electric and magnetic dipole moments. Since the vertical and horizontal electric field strength which is radiated from the DUT is the electric field strength radiated from electric and magnetic dipole, it can be calculated by fifteen power values.

In short, in the present invention, the method of obtaining the of electric field radiated is even related to the amplitude and phase of the dipole moment components as well as the spatial coordinates. For this reason, the GTEM result of the present invention has a close correlation with the OATS. Furthermore, the present invention can obtain a radiated emission value within a short time with only a GTEM cell, without actual measurement of the radiated emission on OATS over a long time. In addition, the present invention accomplishes more accurate estimation of the radiated emission by considering both the amplitude and the phase difference of the respective dipole when the DUT is modeled with the dipoles moments, as compared with the conventional correlation algorithm.

BRIEF DESCRIPTION OF THE ATTACHED DRAWINGS

FIGS. 9A and 9B illustrate application of an image theory for calculation of radiated emission;

Figure 11A:
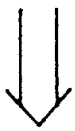
Figure 11A:
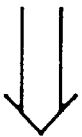

FIGS. 11A and 11A' illustrate the comparison of the value measured using a GTEM cell and the value measured on a ground plane (oats or semi-anechoic chamber) with regards to the vertical electric field strength;

FIG. 11B illustrates the comparison of the value measured by a GTEM cell and the value measured by the OATS with regards to the horizontal electric field strength; and FIG. 12 shows the table of analyzing the correlation between GTEM cell and OATS.

Figure 5:
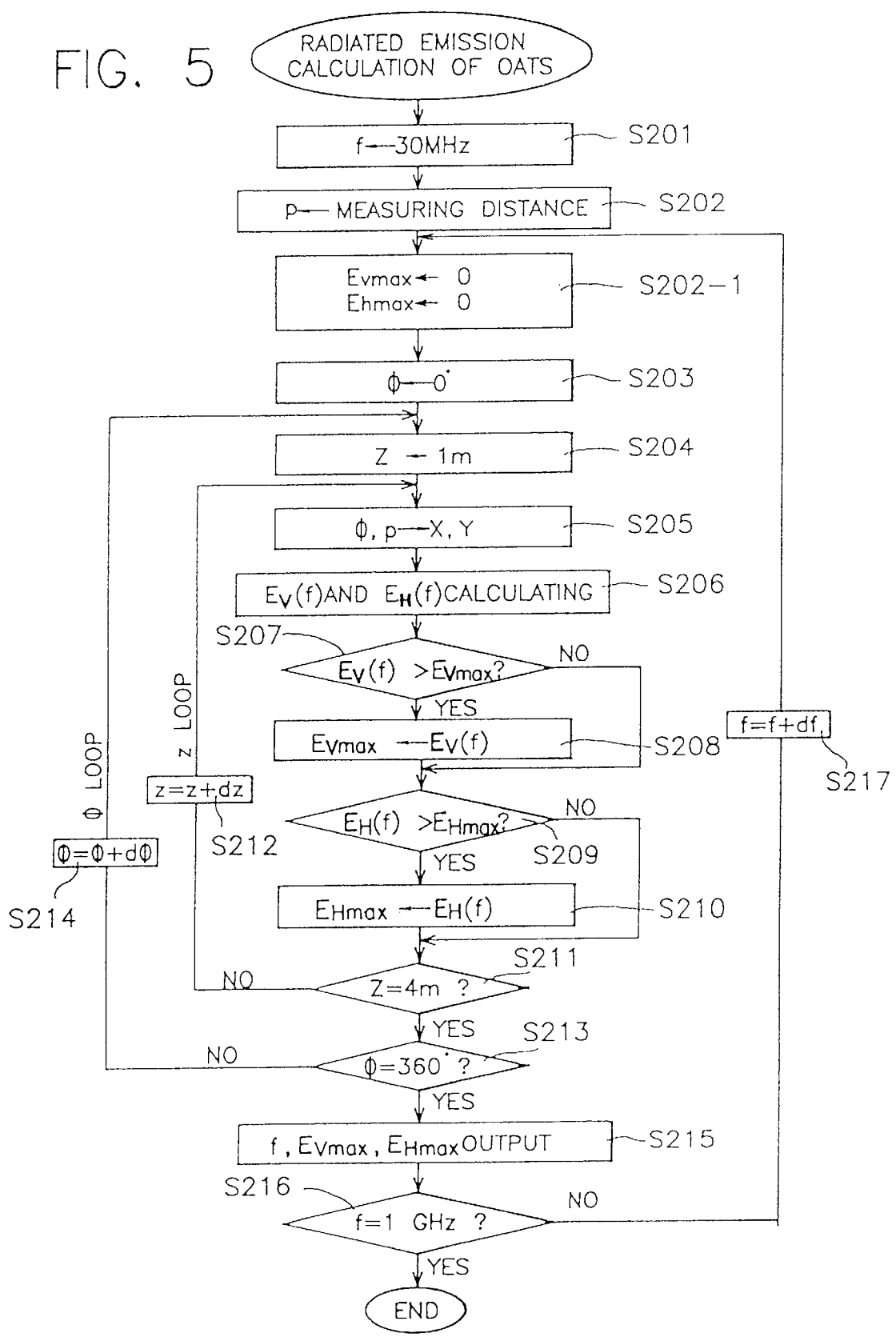
FIG. 5 is a flowchart of calculation of radiated emission of FIG. 4.
Figure 13:
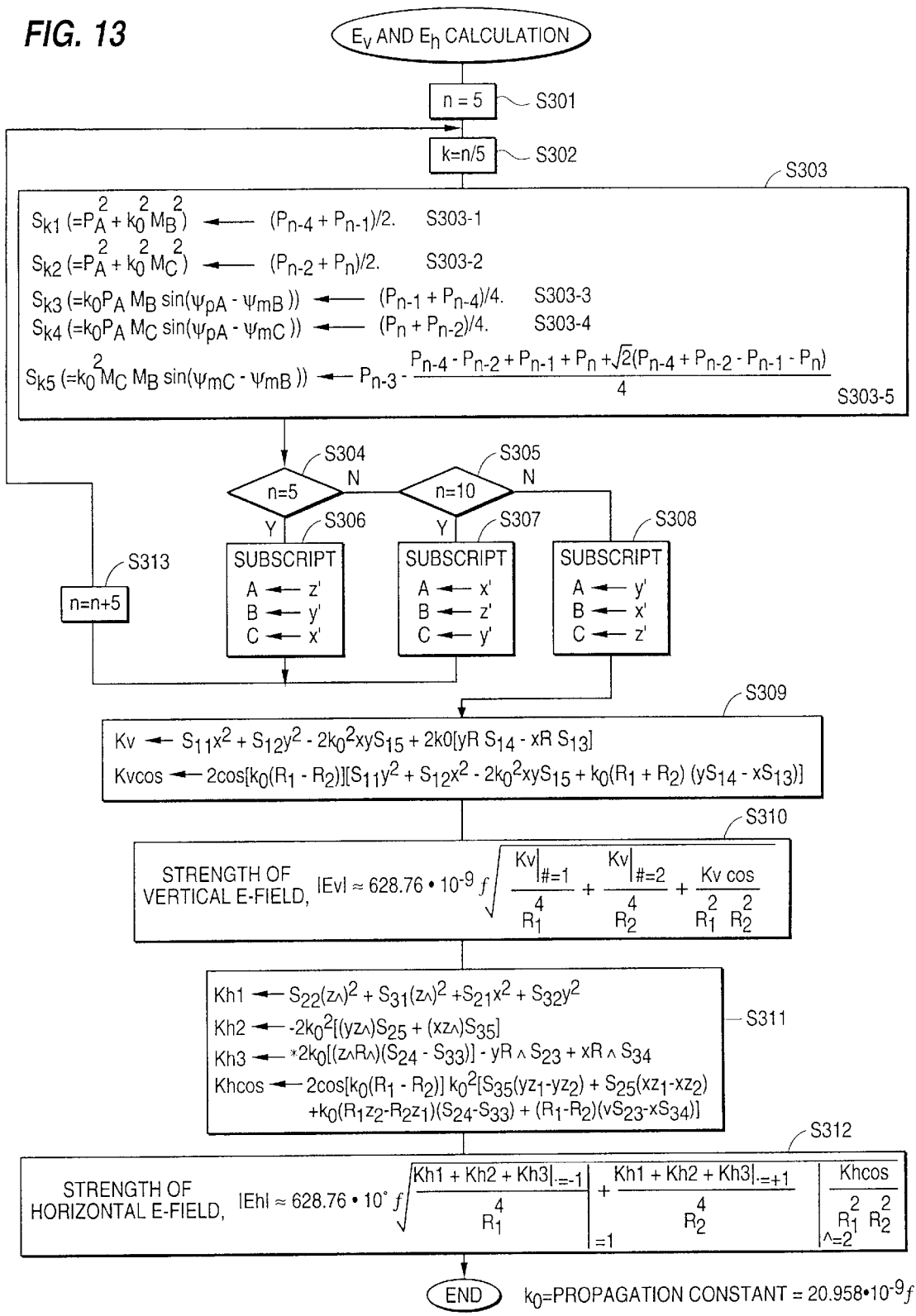

FIG. 13 illustrates vertical electric field and horizontal electric field calculating procedure of FIG. 5.

DETAILED DESCRIPTION OF PREFERRED EMBODIMENT

Hereinafter, a preferred embodiment of the present invention will be described with reference to the attached drawings.

Figure 1:
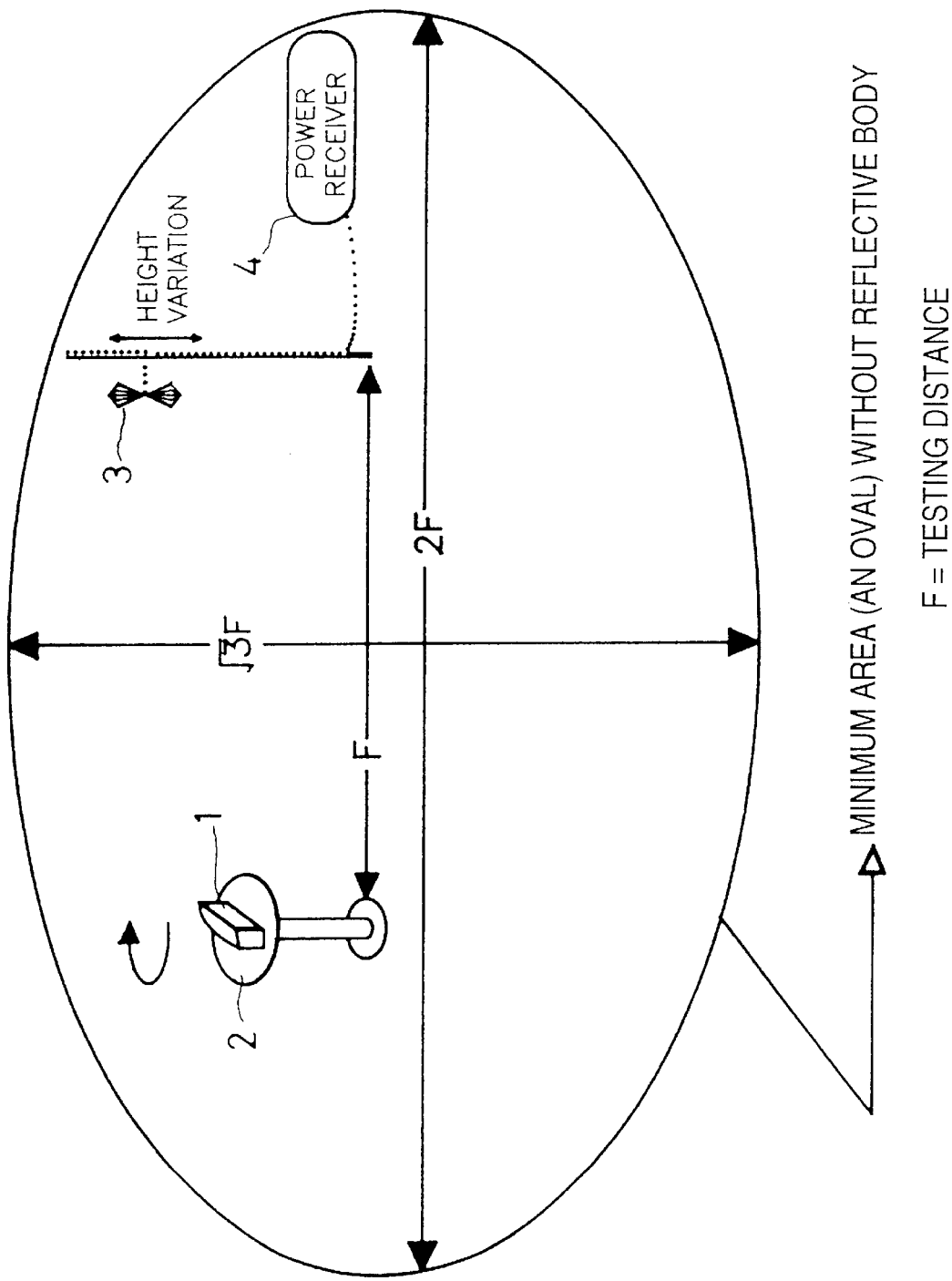
FIG. 1 illustrates a configuration of measurement environment of radiated emission in OATS.
Figure 2:
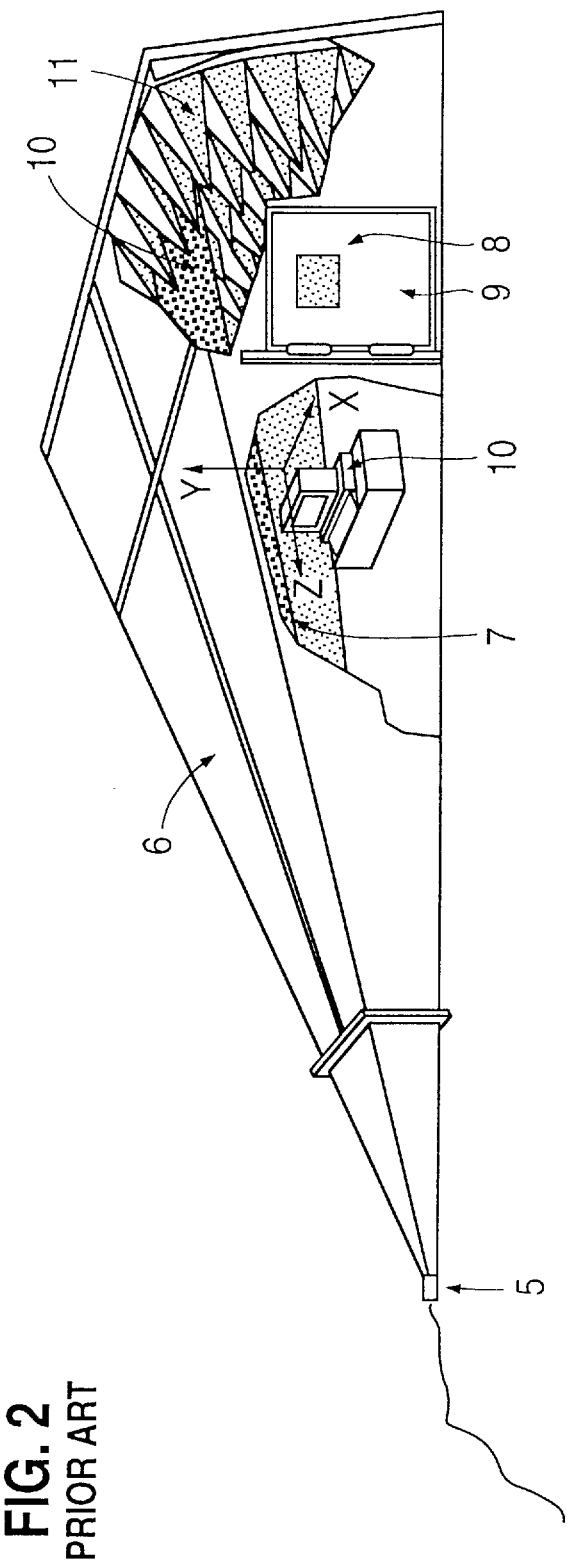
FIG. 2 illustrates an external and internal configuration of a GTEM cell.
Figure 3:
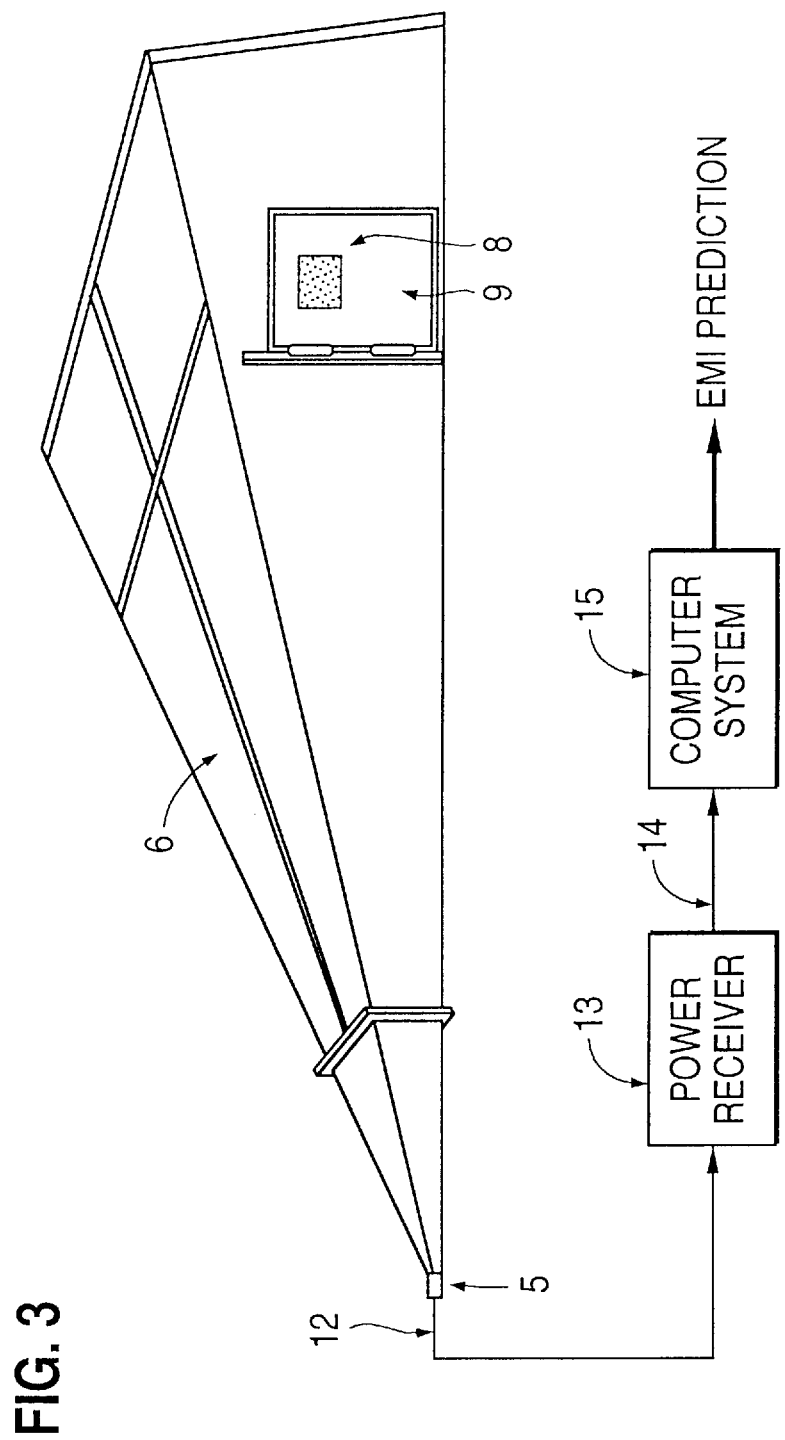
FIG. 3 illustrates the configuration of a system for measuring radiated emission by the GTEM cell to which the present invention is applied.

Referring to FIG. 3, in addition to the configuration of FIG. 2, there are further included a power receiver 13 for receiving power transmitted from a coaxial connector 5 via a coaxial cable 12 and thereby measuring the power, and a computer system 15 for receiving the measured power via a GPIB cable 14 and thereby calculating EMI in accordance with the algorithm of this invention. The operation of the radiated emission measuring system of the present invention will be explained below with reference to FIGS. 2 and 3.

Figure 4:
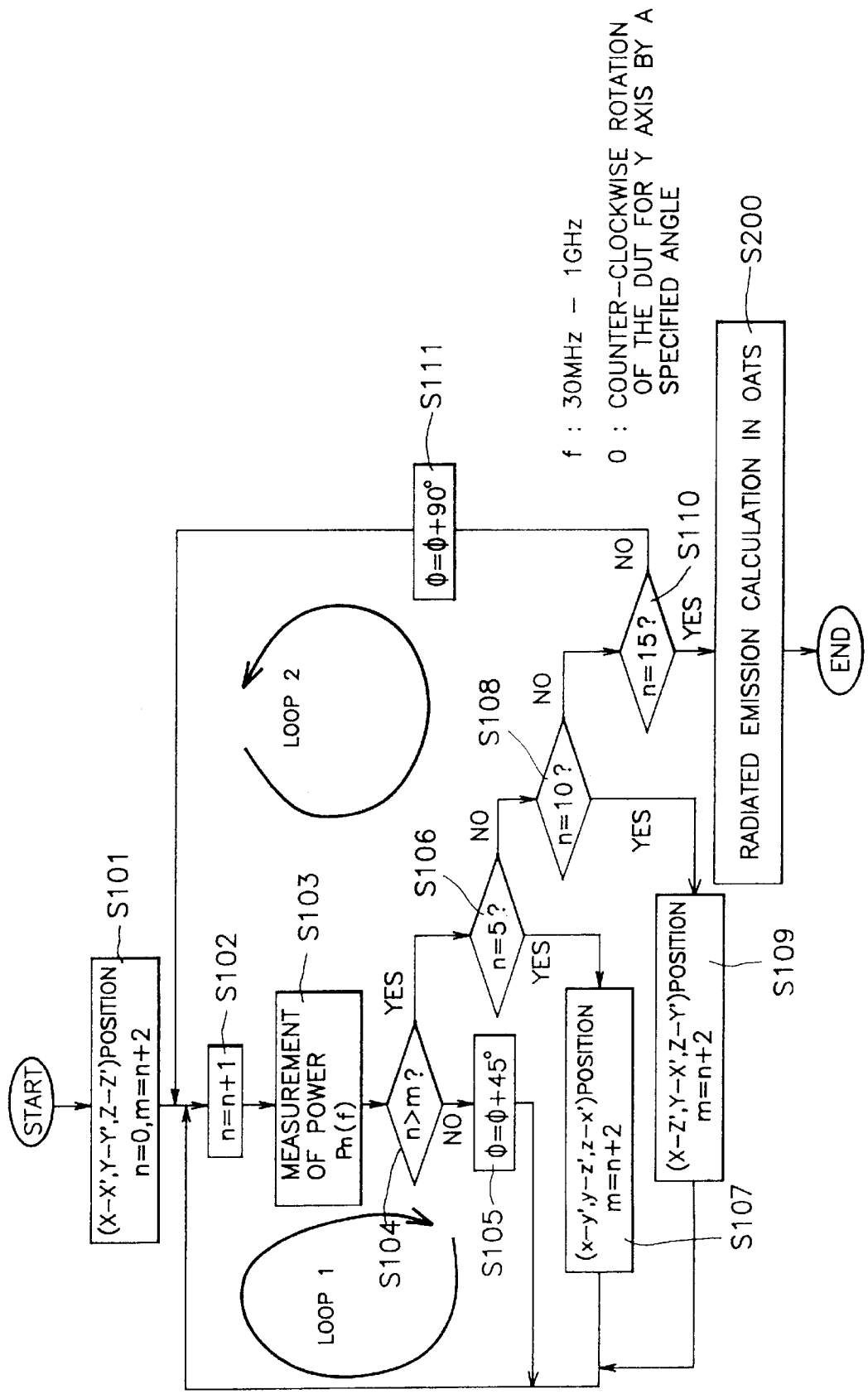
FIG. 4 is a flowchart of measurement of radiated emission in accordance with the present invention.

In this embodiment, a personal computer serves as an example of its DUT. A normally operating DUT 1 is disposed inside GTEM cell. Power transmitted from DUT 1 placed at its reference position according to the sequence of FIG. 4 is output to coaxial connector 5, which is the output port of the GTEM cell.

Power receiver 13 accepts the power transmitted from coaxial connector 5 via coaxial cable 12, and then measures the power within the test band (30 MHz–1 GHz) of radiated emission. When the direction (arrangement) of DUT 1 is changed in accordance with FIG. 4, power receiver 13 repeatedly measures the power transmitted. The power data transmitted from power receiver 13 is input to computer system 15 via GPIB cable 14.

Computer system 15 receives the measured power in the form of a data file, and performs the process of calculation of radiated emission in OATS according to the steps shown on FIG. 5. Therefore, the maximum electric field emitted from the DUT can be predicted in OATS over the whole band of the radiated emission test.

From now on, an algorithm of the present invention will be discussed referring to FIGS. 4 and 5.

First of all, referring to FIG. 4, steps S101–S111 show that the power of radiated emission which is generated in the respective rotating positions and transmitted to the output end of GTEM cell is measured while the DUT is rotated.

Figure 6:
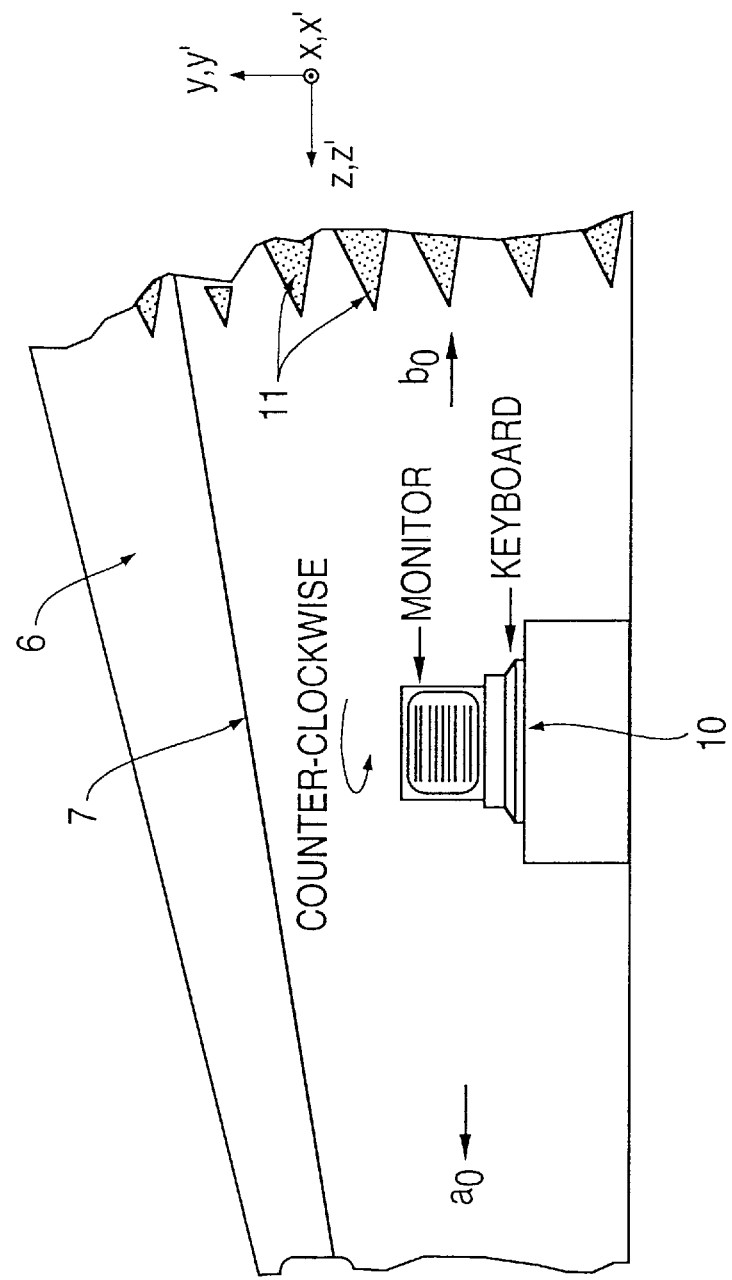
FIGS. 6, 7 and 8 illustrate the arrangement of coordinates of FIG. 4, showing the position of the DUT in measurement.

Specifically, in step S101, DUT 1 is disposed in the form of FIG. 6, i.e. (X-X', Y-Y', Z-Z') arrangement, and measurement parameters n and m are initialized into n=0 , and m=n+2. In step S102, first measurement parameter n indicative of the arrangement number of DUT 1 is increased by 1 (n=n+1). In step S103, power $P_f$ (n) transmitted from the DUT is measured in accordance with first measurement parameter n.

After the measurement in step S103, the magnitudes of first and second measurement parameters, that is, arrangement number n and m are compared in step S104, and if the first measurement parameter n is not greater than second measurement parameter m, then the process goes to step S105. In step S105, DUT 1 is rotated by 45° counterclockwise with respect to the axis Y, and then the process returns to step S102.

While steps S102–S105(Loop1) are repeated, if first and second measurement parameters n and m are compared in step S104 and the first measurement parameter n is greater than the second measurement parameter m, step S106 runs. Step S106 determines whether the first measurement parameter n is equal to 5. Here, if so, step S107 runs. In step S107, second measurement parameter m is set as a value (m=n+2) greater than first measurement parameter n by 2. DUT 1 is arranged by a tester as the form, (X-Y', Y-Z', Z-X') shown in FIG. 7, and then step S102 runs.

Meanwhile, in step S106, since it is determined that the first measurement parameter n is not equal to 5, the process returns to step S108. In step S108, it is determined whether the first measurement parameter n is equal to 10. If so, step S109 runs, and if not, step S110 runs. In step S110, when the first measurement parameter(n) is not equal to "10", DUT 1 rotates counterclockwise by 90° with respect to vertical axis, and step S102 runs. In step S109, second measurement parameter m is set as a value (m=n+2) greater than first measurement parameter n by 2. Then, DUT 1 is placed by the tester as the form, i.e. (X-Z', Y-X', Z-Y') shown in FIG. 8, and then step S102 runs, and Loop1 is performed three times by checking parameters (m, n). Then step S106 and step S108 are performed, and step S110 runs.

Step S110 decides whether the first measurement parameter n is equal to 15, and if not, step Sill runs. Then, in accordance with checking parameters(m,n), Loop2 is performed three times, and step S200 runs.

The detailed operation for the calculation of the radiated emission of OATS of step S200 is shown in FIG. 5. FIG. 5 depicts the calculating procedure of electric field radiated from the same DUT on OATS with having fifteen powers of $P_1(f)$, $P_2(f)$, $P_{15}(f)$.

In step S201, the frequency f used in measurement of emission electric field strength is initialized to the lowest test frequency, that is, 30 MHz. In step S202, the distance to calculate radiated magnitude from DUT is set as radial distance ρ from center of low ground of DUT. In step S203, the rotation angle Φ of the DUT is initialized to 0°. In step S204, the height of DUT 1 is set as that(h) of turntable(2) shown in FIG. 9.

By step S204, when selecting a parameter for calculating is finished, the observation point(the position of antenna in FIG. 9) which calculates electric field radiated from DUT 1 is changed from the perpendicular coordinate(x,y) to the cylindrical coordinate(ρ,Φ).

Hereinafter, $P_1(f), P_2(f), \ldots P_{15}(f)$ are to be correlated with amplitude and phase value of electric and magnetic dipole moments by which the DUT is characterized. The direction amplitudes of electric dipole moment $\vec{P}(f)$ are set as $P_x(f), P_y(f)$ and $P_z(f)$ respectively, and the phases are set as $\Phi_{px}(f)$ $\Phi_{py}(f)$ and $\Phi_{pz}(f)$ respectively. Similarly, the direction amplitudes of magnetic dipole moment $\vec{M}(f)$ are set as $M_x(f), M_y(f)$ and $M_z(f)$ respectively, and the phases are set as $\Phi_{mx}(f), \Phi_{my}(f)$ and $\Phi_{my}(f)$ respectively. From the above algorithm, the correlation of the GTEM output power, $P_n(f)$ with electric dipole moment $\vec{P}(f)$ and magnetic dipole $\vec{M}(f)$ is depicted in FIG. 13.

FIG. 13 depicts step 206 in FIG. 5, which is a step for transferring fifteen GTEM cell output end powers in a fixed frequency obtained in the step prior to the present invention to OATS value of a final object as a step carried out after a frequency of S201, observation points of S202 and S204, and a position of DUT are set. Since every frequency in FIG. 13 is fixed, in order to make a simple indication, $P_n(f)$ is indicated as $P_n$, and $\vec{P}(f)$ and $\vec{M}(f)$ are indicated as P and M respectively, and parameter $S_{ki}(f) (i=1, 2, \ldots, 5)$ is also $S_{ki}$.

First, in step S301, n is set as 5, and in step S302, the value is divided by 5, an then the divided value is saved. Therefore, the value of first "k" is "1".

In the next step S303-1 of S303, $P_{n-4}$ and $P_{p-1}$ are indicated as $P_1$ and $P_4$ respectively and the average value of $P_1$ and $P_4$ results in $P_A^2 + k_o^2 M_B^2$ (A: one of x, y, or z, B: one of x, y, or z, $k_o = 20.958E-9f$), which is saved in $S_{11}$, by which GTEM output powers P1 and P4 are correlated with the predetermined components of electric and magnetic dipole moments. In the step S303-2 of S303, $P_{n-2}$ and $P_n$ are indicated as $P_3$ and $P_5$ respectively and the average value of $P_3$ and $P_5$ results in $P_A^2 + k_o^2 M_c^2$, which is saved in $S_{12}$. In the step S303-3 of S303, the ¼ of difference between $P_4$ and $P_1$ results in $k_o P_A M_B \sin(\psi_{pA} - \psi_{mB})$, which is saved in $S_{13}$. The $\psi_{pA}$ is the phase of A component (A: one of x, y, or z) of electric dipole moment $\vec{P}$, and the $\psi_{mB}$ is the phase of B component(B: one of x, y, or z) of magnetic dipole moment $\vec{M}$. In the step S303-4 of S303, the ¼ of the difference between $P_5$ and $P_3$ results in $k_o P_A M_c \sin(\psi_{pA} - \psi_{mC})$, which is saved in $S_{13}$. The $\psi_{pA}$ is the phase of A component (A: one of x, y, or z) of electric dipole moment $\vec{P}$, and the $\psi_{mC}$ is the phase of C component (B: one of x, y, or z) of magnetic dipole moment $\vec{M}$. In the step S303-5 of S303, the cosine combined magnitude($k_o^2 M_c M_B \cos(\psi_{mC} - \psi_{mB})$) of B and C components of magnetic dipole moment is obtained by using five powers, $P_1, P_2, \ldots, P_5$, and the obtained value is saved in $S_{15}$.

Then, in the next step S304, after detecting whether or not an estimating parameter "n" is same as "5", if so, step S306 runs, in which it is determined which of three directions of perpendicular coordinate the component of dipole indicates. At first, A becomes z, C becomes y and C becomes x due to n=5. Then, step S313 runs.

In the step S313, n is saved as 5 which is then added to prior n, and then, step S302 is carried out again. At this time, k becomes 2 because n=10. In step S303, an average value of $P_6$ and $P_9$ is saved in parameter $S_{21}$, that of $P_8$ and $P_{10}$ in $S_{21}$, ¼ of difference of $P_9$ and $P_6$ in $S_{23}$, ¼ of the difference of $P_{10}$ and $P_8$ in $S_{24}$, and in step S303-5, cosine combined magnitude ($k_o^2 M_C M_B \cos(\psi_{mC} - \psi_{mB})$) of B and C components of magnetic dipole moment which is obtained by using five powers, $P_6, P_7, \ldots P_{10}$ is saved in $S_{25}$.

Since n is not 5 in next step S304, "yes" is chosen in step S305, and therefore, the values of A, B, and C, are substituted with x, z and y respectively. Then, step S313 runs.

In step S331, n is saved as 15, the value that 5 is added to prior n, and then step S302 runs. At this time, k becomes 3 due to n=15. In step S303, an average value of $P_{11}$ and $P_{14}$ is saved in parameter $S_{31}$, that of $P_{13}$ and $P_{15}$ in $S_{31}$, ¼ of the difference of $P_{14}$ and $P_{11}$ in $S_{33}$, ¼ of difference of $P_{15}$ and $P_{13}$ in $S_{34}$, and in step S303-5, cosine combined magnitude ($k_o^2 M_C M_B \cos(\psi_{mC} - \psi_{mB})$) of B and C components of magnetic dipole moment which is obtained by using five powers, $P_{11}, P_{12}, \ldots P_{15}$ is saved in $S_{35}$.

Since n is neither 5 nor 10 in next steps S304 and S305, step S308 runs, and then, the values of A, B, and C, are substituted with x, z and y respectively. Then, step S309 runs.

In step S309, auxiliary parameters, $K_V$ and $K_{VCOS}$ for calculating radiated vertical electric field are defined. $K_V$ consists of observation point, S11, S12, . . . , S15 which is composed of GTEM cell output end power, i.e. coordinate (x, y, z) of point for obtaining electric field, each distance, $R_1$ and $R_2$ from real DUT and virtual source of DUT to observation point. $R_\alpha$ indicates distance, $R_1$ from real DUT to observation point(x, y, z), or distance, R2 from DUT by image effect located under the ground of OATS to observation point(x,y,z). Accordingly, $R_1$ is the distance from location point(0, 0, h) of DUT to observation point(x, y, z) and $R_2$ is distance from location point(0, 0, —h) of virtual source of DUT under the ground to observation point(x, y, z). In step S310, $K_v$ is determined when subscript $\propto$ is 1 and 2 respectively. $K_{VCOS}$, as magnitude when $R_1$ is combined with $R_2$, is also composed of the measured GTEM power S11, S12, . . . , S15, the coordinate(x, y, z) of observation point, and distances, $R_1$ and $R_2$ from DUT to the observation point. After calculating $K_V$ and $K_{VCOS}$, step S310 runs.

At last, the vertical field on OATS is calculated in step S310, and it is simply obtained utilizing said $K_V$ and $K_{VCOS}$. The strength of vertical radiated field $E_V$ is obtained by the following equation;

$$\text{Strength of vertical E-Field } |E_v| \approx 62.876 \cdot 10^{-4} f \sqrt{\frac{K_V|_{\#=1}}{R_1^4} + \frac{K_V|_{\#=2}}{R_2^4} + \frac{K_V \cos}{R_1^2 R_2^2}} \quad \text{S310}$$

Then, step S311 runs to obtain radiated horizontal electric field. In step S311, auxiliary parameters, Kh1, Kh2, Kh3 and Khcos are utilized for calculating radiated horizontal electric field. $Z_\beta$ indicates $Z_1$ or $Z_2$, and $R_\beta$ indicates $R_1$ or $R_2$. $Z_\beta$ and $R_\beta$ are determined in step S312. * of Kh3 is +1 or −1, and it is determined in step S312.

In step S312, strength of radiated horizontal electric field is same as that of vertical electric field except for value under the square root. * of Kh3, third term of numerator components of first term of three terms is −1, and $z_\beta$ in the first term under square root becomes $z_1$, and $R_\beta$ becomes $R_1$. And * of Kh3, third term of numerator components of second term of three terms, is −1, and $z_β$ in the first term under square root becomes $Z_2$, and $R_β$ becomes $R_2$. Finally, Khcos is divided by $R_1^2R_2^2$. Accordingly, the strength of radiated horizontal electric field is obtained by following equation;

$$\text{Strength of horizontal E-field } |Eh| \approx \left| \frac{\eta_0 k_0}{4\pi} \right| \sqrt{\left. \frac{Kh1 + Kh2 + Kh3|_{*=-1}}{R_1^4} \right|_{\beta=1} + \left. \frac{Kh1 + Kh2 + Kh3|_{*=+1}}{R_2^4} \right|_{\beta=2} + \frac{Kh\cos}{R_1^2 R_2^2}}$$

S312 → END

After finishing the calculating procedure of FIG. 13, step S207 runs with each value of vertical electric field(Ev(f)) and horizontal electric field(Eh(f)).

Step S207, S208, S209 and S210 are procedures for storing each maximum of the radiated vertical electric field and radiated horizontal electric field in special range of estimating distance of frequency f;ρ, height 1–4 m, Φ=0°–360°.

In a comparison of S207, if the vertical electric field Ev(f) is greater than the horizontal electric field $E_h$(f), step S208 runs. Otherwise, the calculating step is diverged to "NO" and the same procedure as the horizontal electric field effect runs. If the comparison of the horizontal electric field by step S210 is finished, step S211 runs. In step S211, if z is under 4 m, z component of the observation point is to be increased as many as dz such as S212. If z is 4 m, the height(z) of observation point is the maximum, step S213 runs and direction angle of the observation point(Φ) is estimated. If Φ is under 360°, the calculating step is diverged to step S214 and Φ is to be increased as many as dΦ, and step S204 runs again and the value of z is to be initialized. If Φ is 360° in step S213, which means the maximum of electric field calculated from every observation point at one frequency is stored, step S215 runs to output a result. In condition that ρ of cylinder coordinate is fixed in S202, all of the observation points become a cylinder shape of height semidiameter ρ, and height 3 m, semidiameter ρ, and height 3 m, for example semidiameter ρ: 3 m, height : 1 m–4 m and angle Φ: 0°–360°. Namely, at one frequency f the electric field radiated from the DUT are calculated, and then, the maximum of values calculated is stored, and it is output in step S215. FIG. 9A is described as an example of dz=20 cm and dΦ=10°.

In the next step S216, the above procedures are carried out until the algorithm is the maximum test frequency 1 GHz after testing the maximum frequency. If frequency(f) is not more than 1 GHz, step S217 runs and the frequency is increased as many as df, and then, runs new step S202-1 and again initiates each of the values of vertical and horizontal electric field after frequency is set, and then, the next step runs and initiate coordinate of observation point. Namely, the coordinates of observation points get moved through zLoop and SLoop as antenna is moved in real OATS.

As stated above, in this embodiment, the number of power measurements (the number of direction change of the DUT) is fifteen which is increased by three from the prior art. However, this takes only several minutes more in measurement time, and thus can be ignored.

It is noted in the present invention that more accurate, more stable estimation of the amount of emission is enabled, by comparing the value measured using the GTEM cell and the value measured on OATS. Suppose the measurement distance is far greater than the height of the antenna in the present invention, the approximation of several terms is available, and the radiated emission expression from the DUT on OATS can be indicated by algebraical coupling of fifteen terms.

In order to obtain fifteen unknown terms, there must be acquired fifteen independent GTEM cell output powers measured through the direction changes in the DUT of the GTEM cell.

This is because the powers have correlation with the radiated emission on the OATS. For simulation of radiated emission from the DUT on OATS, fifteen arrangements of the DUT are required in the GTEM cell.

The fifteen arrangements of the DUT will be explained in more detail with reference to FIGS. 4, 6, 7 and 8. The basic arrangements of the DUT are divided roughly into three basic XX', XY', and XZ'. These three arrangements of DUT are (X-X', Y-Y', Z-Z'), (X-Y', "Y-X', Z-X'), and (X-Z', Y-X'Z-Y') in the FIG. 6, 7 and 8, respectively. The axis of coordinate of DUT corresponding to those arrangements may be disposed arbitrarily by the user.

At the three initial positions, rotations by 0°, 45°, 90°, 180°, and 270° are performed counterclockwise with respect to the 5 vertical axis (axis Y), to thereby take five arrangements. Therefore, fifteen arrangements of DUT are required in total.

The original coordinates of the GTEM cell are set as (X, Y, Z), and the coordinates of the DUT being (X', Y', Z'). As shown in FIG. 2, in the original coordinates (X, Y, Z) of the GTEM cell, the output stage of the GTEM cell is directed to axis Z, the vertical direction to axis Y, and axis to the right from the GTEM cell output stage according to the right screw law, under the inner conductor 7 where the DUT 1 is placed ($\vec{Y} \times \vec{Z} = \vec{X}$, $\vec{X}$, $\vec{Y}$, and $\vec{Z}$ are unit vectors), that is, the septum.

Figure 7:
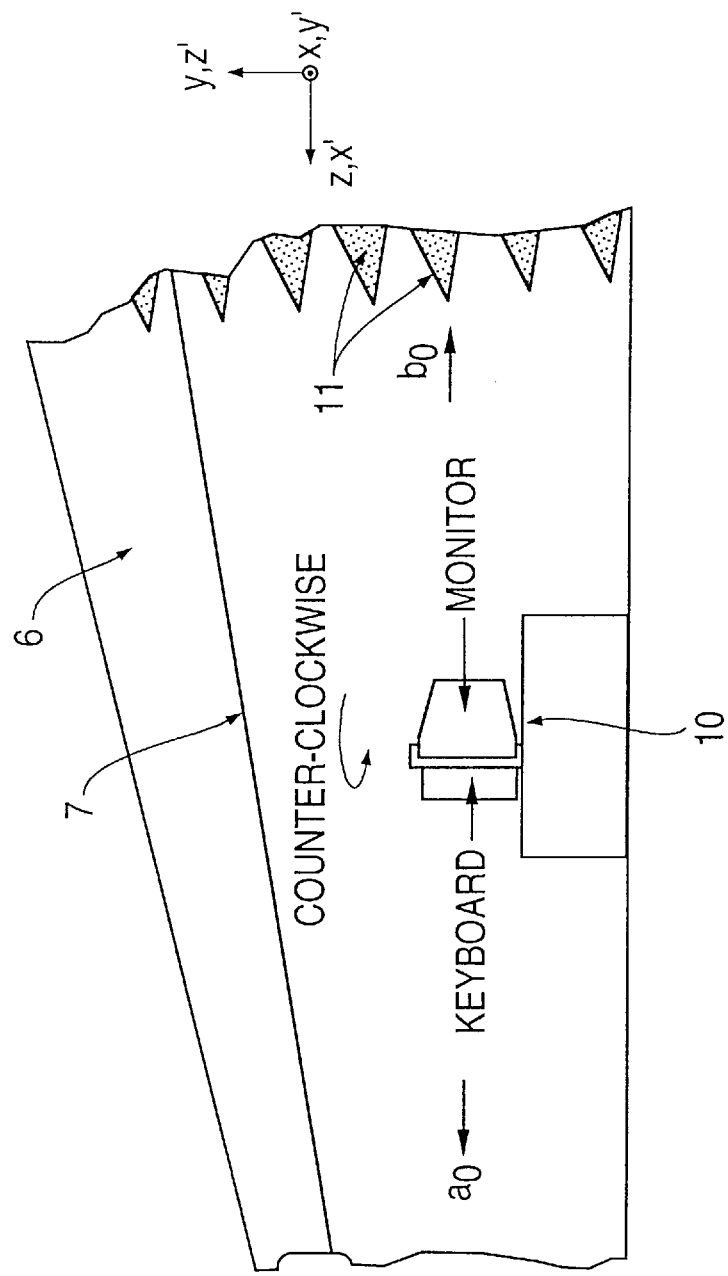
Figure 8:
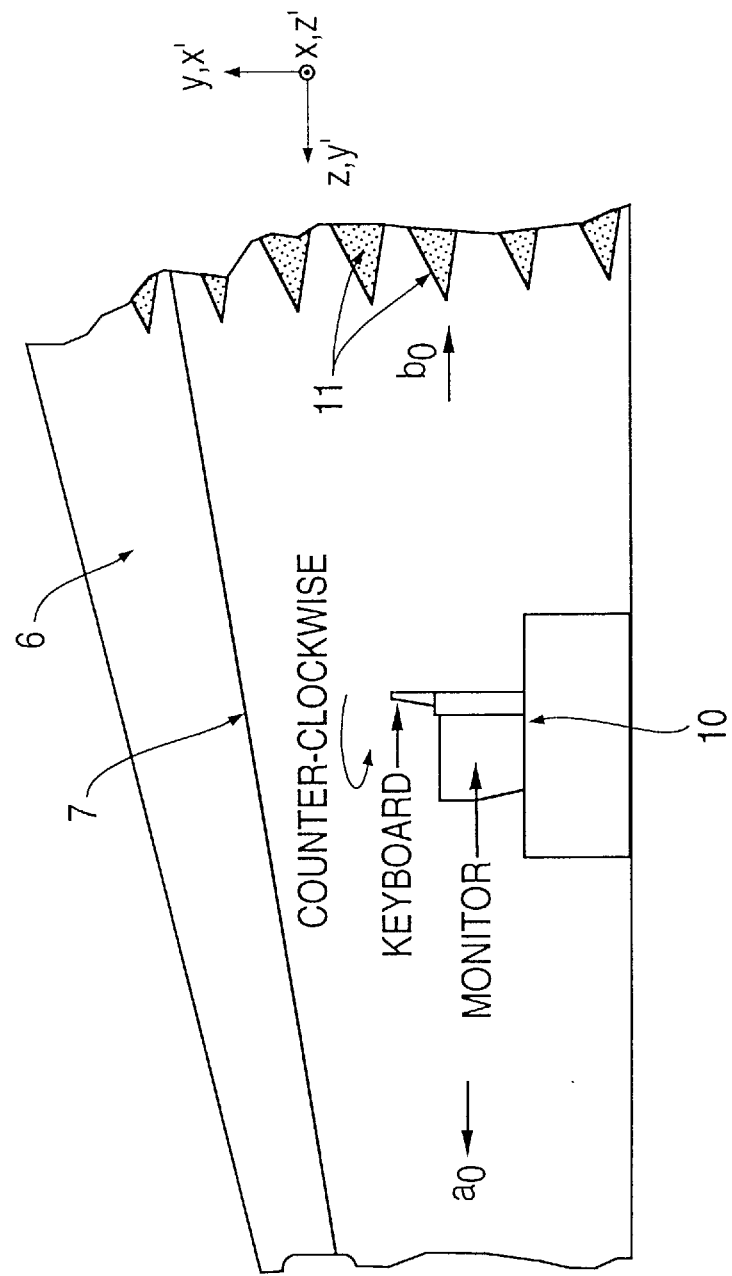

The axis of coordinates (X', Y', Z') of the DUT, can be disposed by the user, taking the center of the volume of the DUT as the starting point in the normal arrangement. An example of the coordinates of the DUT are shown in FIGS. 6, 7 and 8. These drawings show examples of the three basic arrangements of the DUT inside the cell for measuring the radiated emission with the GTEM cell, taking a PC as its example. In FIG. 6 which shows the normal arrangement of the PC, the direction coming out from the center of the PC is axis X', the vertical direction being axis Y', and the left direction being axis Z'. From now on, the measuring procedure with the three basic arrangements (X-X', Y-Y', Z-Z'), (X-Y', Y-Z', Z-X') and (X-Z', Y-X', Z-Y') will be explained with reference to FIG. 4.

First of all, the measurement of radiated emission in accordance with the basic arrangement (X-X', Y-Y', Z-Z') of DUT 1 will described, referring to FIG. 6. Given that n=0, m=n+2=2, n is increased by 1. Then, the power of the GTEM cell output stage is measured. The output stage power is represented by $P_n(f)$. Here, character n and f indicate the arrangement number and frequency points, respectively. All of $P_n(f)$ for a set frequency band is read via the power receiver. Power measurement is performed by receiving $P_n$(30 MHz), $P_n$(30 MHz+df), $P_n$(30 MHz+2 df), ..., $P_n$(1 GHz) at one time. The number of powers at arrangement 1 ($P_1$(30 MHz), $P_1$(30 MHz+df), ..., $P_1$(1 GHz)) is the same as the total number of the frequency points, which would be varied with the setting of the bandwidth where reception is available by the power receiver. This depends upon how many times the radiated emission measurement band (30 MHz–1 GHz) is divided since the number of data readable by the power receiver is limited.

In case of basic arrangement (X-X', Y-Y', Z-Z'), if n=0 initially, n becomes 1 so that the power of the GTEM cell output stage becomes $P_f(1)$, as shown in FIG. 4. Here, the power measurement of the GTEM cell output stage is received by power receiver 13 of FIG. 3. In order to obtain the maximum amount of emission, a predetermined period of time is taken until the maximum value, and then this value is input to computer system 15. If n=1 and m=2 are compared and n is not greater than m, the DUT is rotated by 45°. The rotation angles are all taken counterclockwise with respect to axis Y of the GTEM cell.

Then n is increased by 1 (n=2), and then power $P_2(f)$ is measured. If n=2 and m=2 are compared and n is not greater than m, the arrangement is rotated by 45°, n is increased, and then power $P_3(f)$ is measured. Accordingly, n becomes 3, and greater than m=2. According to the comparison of n and m, this step diverges to YES. Here, since n is 3, this satisfies the condition of n≠5, n≠10, and n≠15 so that the DUT is rotated by 90°. As in the prior art, n is increased to become 4, and power $P_4(f)$ is measured. Again, since n is 4, loop 2 is performed to render n 5, and power $P_5(f)$ is measured.

In the flowchart of FIG. 4, rotation angle φ is expressed as being accumulated. The five arrangements of measurement numbers n=1~5 can be expressed in another way that the initial arrangement XX' is rotated by 0°, 45°, 90°, 180°, and 270° counterclockwise.

When n and m are compared, n>m and n=5, the arrangement of the DUT must be disposed as to the basic arrangement (X-Y', Y-Z', Z-X'). This arrangement XY' is shown in FIG. 7 so that coordinates (X', Y', Z') coincide with the reference coordinates (Z, X, Y) of the GTEM cell. As shown in FIG. 4, after m=n+2=7, the arrangement number n is increased by 1 (n=6), and power $P_6(f)$ is measured. When n=6 and m=7 are compared and n is not greater than m, the DUT 1 is rotated by 45°. n is increased by 1 (n=7), and power $P_7(f)$ is measured.

When n=7 and m=7 are compared and n is yet not greater than m, the DUT is rotated by 45°, and power $P_8(f)$ is measured. When n becomes 8 and is then compared with m, n is greater than m so that this step diverges to YES. In this case, n≠5, n≠10, and n≠15 so that DUT 10 is rotated by 90°. As in the prior art, n is increased to become 9, and power $P_9(f)$ is measured.

In the flowchart of FIG. 4, rotation angle φ is expressed as being accumulated. The five arrangements of measurement numbers n=6~10 can be expressed in another way that the initial arrangement (X-Y',Y-Z',Z-X') is rotated by 0°, 45°, 90°, 180°, and 270° counterclockwise.

When n and m are compared, n>m, n≠5 and n=10, the arrangement of the DUT must be disposed as (X-Z',Y-X',Z-Y'). This arrangement (X-Z', Y-X', Z-Y') is made as shown in FIG. 8 so that coordinates (X', Y', Z') coincide with the reference coordinates (Y, Z, X) of the GTEM cell. As shown in FIG. 4, after m=n+2=12, n is increased by 1 (n=11), and power $P_{11}(f)$ is measured. When n=11 and m=12 are compared and n is not greater than m, the DUT 1 is rotated by 45°. n is increased by 1 (n=12), and power $P_{12}(f)$ is measured.

When n=12 and m=12 are compared and n is yet not greater than m, the DUT is rotated by 45°. n is increased (n=13), and power $P_{13}(f)$ is measured. When n=13 and m=12 are compared and n is greater than m, this step diverges to YES. This satisfies the condition of n≠5, n≠10, and n≠15 so that the DUT is rotated by 90°. n is increased to 14, and power $P_{14}(f)$ is measured. A loop where n is 13 is performed to render n 15, and power $P_{15}(f)$ is measured.

In the flowchart of FIG. 4, rotation angle Φ is expressed as being accumulated. The five arrangements of measurement numbers n=11~15 can be expressed in another way that the initial arrangement (X-Z', Y-X', Z-Y') is rotated by 0°, 45°, 90°, 180°, and 270° counterclockwise. When n and m are compared, n is greater than m, and the condition of n≠5, n≠10, and n≠15 is satisfied, the power measurement of the GTEM cell output stage is completed. Then, calculation for radiation emission On OATS by the computer system is started.

After the step is completed, the calculation of radiated emission on OATS in step S200 is performed so that, as shown in FIG. 5, a measurement start frequency and a desired measurement distance on OATS are input. The calculation procedure of FIG. 5 acts on the general measuring method of EMI. The measurement of radiated emission on OATS is carried out while the ground is taken as the X-Y plane, and the axis perpendicular to the ground is axis Z.

In the radiated emission in accordance with the actual standards, receiving antenna 3 is placed within a desired measurement distance (3, 10 or 30 m) from DUT 1, and its height sweeps at a proper interval by a user between 1 m and 4 m. DUT 1 placed on turntable 2 at a predetermined height (0.8 m) from the ground corresponding to the variation of the height of the antenna of 1–4 m is rotated by 360°.

According to the above procedure, power receiver 4 receives emission electric field, and records the maximum value at the frequency. Recording of the maximum value is performed both for the horizontal and vertical polarized plane waves. Thereafter, in order to simulate the situation of the OATS with fifteen powers of the GTEM cell output stage, the center of coordinates is put on the center of turntable 2. The center of DUT 1 becomes (X, Y, Z)=(0, 0, 0.8 m). If measured at the distance of 3 m from the receiving antenna 3 (corresponds to the observation point in calculation), the maximum horizontal and vertical receiving electric fields are calculated within the range of (σ, Φ, z)=(3 m, 0°, 1 m)–(3 m, 360°, 4 m), as expressed in cylindrical coordinates. This range can be determined by a user.

Based upon this, the procedure of calculation of radiated emission on OATS will be described with reference to FIG. 5. The initial coordinates (ρ, Φ, z) =(3, 0, 1) of the receiving antenna are input. At the position corresponding to the initial coordinates of the receiving antenna, the vertical electric field $E_v(f)$ and horizontal electric field $E_H(f)$ emitted from the DUT are calculated. These vertical and horizontal electric fields are compared with the maximum vertical electric field $E_{Vmax}$ and maximum horizontal electric field $E_{Hmax}$ which are 0.

If the calculated vertical electric field is greater in the comparison, it is stored as the maximum vertical electric field $E_{Vmax}$. A similar procedure is performed for the horizontal electric field. The electric fields are calculated while increasing the value Z by dZ until z=4 m, and compared with the maximum vertical electric field $E_{Vmax}$ and maximum electric field $E_{Hmax}$ so that greater values are stored.

After the Z loop is finished, φ is increased by dφ in φ loop, and Z is reset as 1 m to perform the Z loop. When this process is performed until φ=360°, the maximum vertical electric field $E_{Vmax}$ and maximum horizontal electric field $E_{Hmax}$ will be obtained at the frequency between 1–4 m of height at a place spaced apart by 3 m from the DUT. At this time, the maximum vertical and horizontal electric fields are output, and then the next frequency is dealt. This process is finished until 1 GHz according to the standards of radiated emission.

The vertical electric field $E_v(f)$ and horizontal electric field $E_H(f)$ are expressed so that fifteen powers of the GTEM cell output stage have correlation with the receiving electric field at a predetermined height in a place spaced apart from the DUT by a predetermined distance on OATS. The fifteen GTEM powers $P_1(f)$~$P_{15}(f)$ are expressed as the vertical and horizontal electric fields.

The spatial coordinates of OATS to which the image effect is applied on OATS for radiated emission calculation is as shown in FIG. 9. The fifteen GTEM power data obtained in accordance with the flowchart of FIG. 5 enables radiated emission result value conforming to that of OATS to be obtained according to the correlation between measured powers of OATS and GTEM.

Of the number of power measurement in accordance with the fifteen arrangements of DUT, one-time measurement takes time to rotate the DUT at a predetermined angle to axis Y after the GTEM cell's access door is opened, and then receive the power value at maximum received by the power receiver with respect to the frequency band after the access door is closed. Here, the power reception and data transmission are available within tens of seconds.

For this reason, even though the present invention requires more time to measure power three times, this adds only several minutes to the whole time of measurement, which does not affect the measurement itself, as compared with the prior art. Though not shown externally, the power of the GTEM cell output stage is calculated including the phase of the respective current components (dipole moment components) of the DUT, having a close correlation with the OATS.

The flowchart of calculation of radiated emission of FIG. 5 consists of the steps of: measuring the radiated emission of the DUT using the GTEM cell, taking the correlation between the expression of the radiated emission in OATS and the GTEM power, and calculating the radiated emission.

Figure 10A:
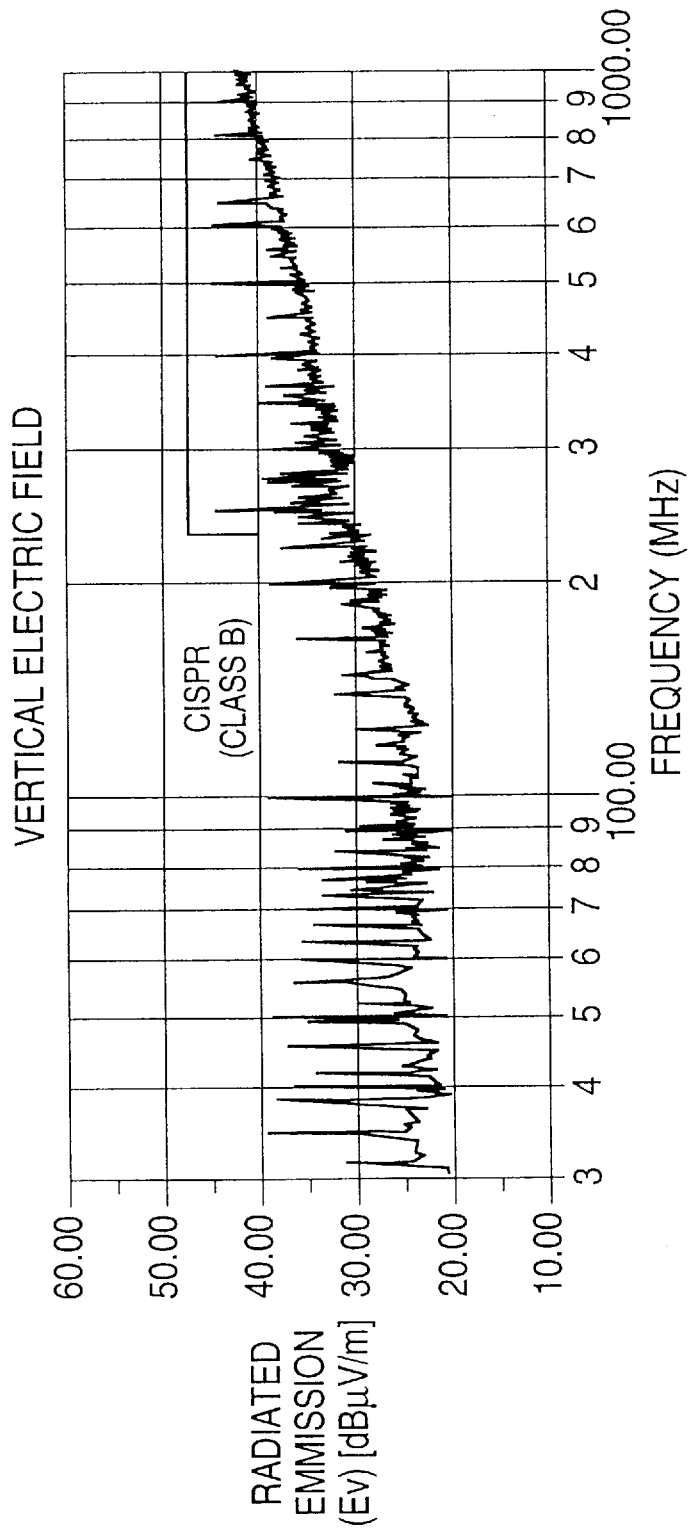
FIGS. 10A and 10B show an actual example of radiated emission using the GTEM cell, with vertical and horizontal emission electric fields of the DUT over the whole frequency band.
Figure 10B:
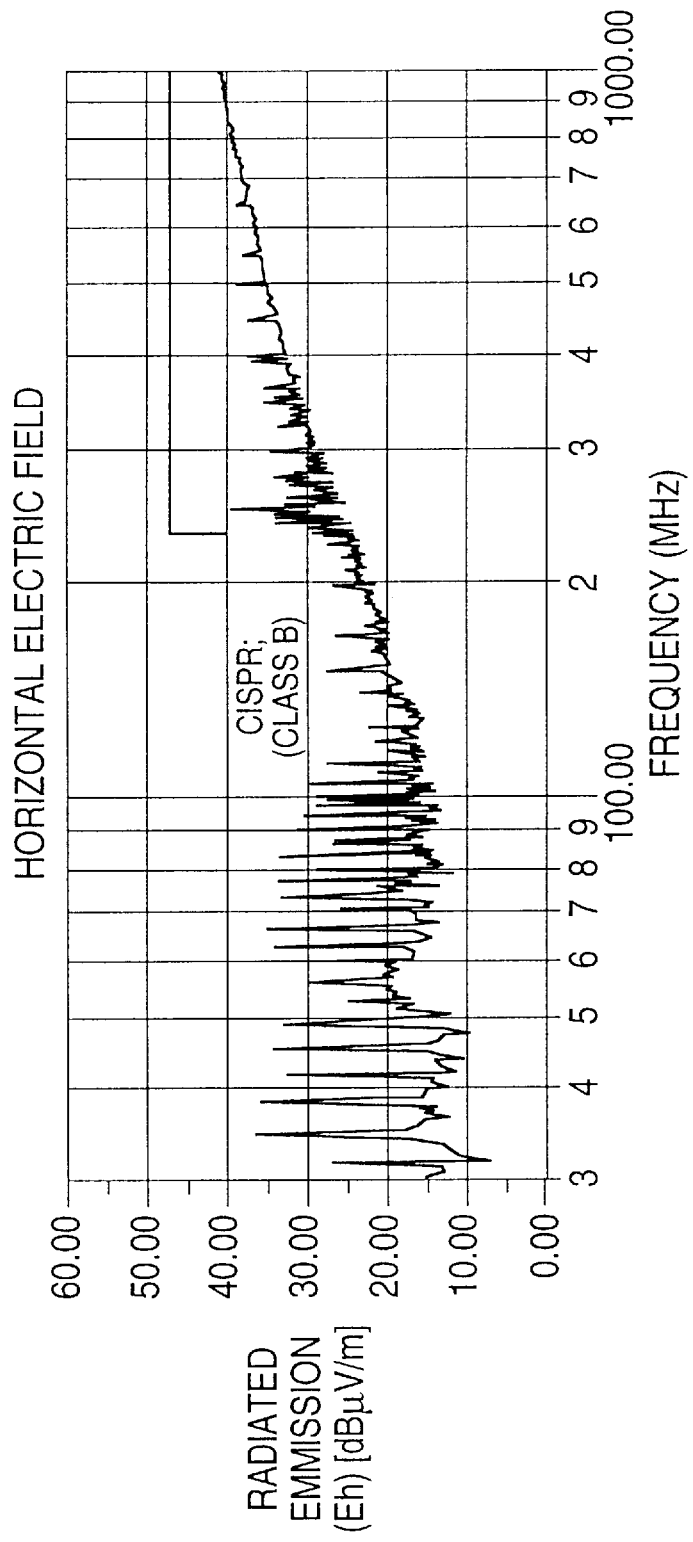

In order to prove the correlation experimentally, the radiated emission of a general notebook computer on ground plane or oats is simulated using the GTEM cell and with fifteen power measurement values. The result is compared with the measurement value of OATS. FIGS. 10A and 10B show the vertical and horizontal components of the radiated electric field of the notebook computer obtained according to the algorithm of FIG. 5 using the GTEM cell. Here, the result of comparison of radiated electric fields within about 10B under the maximum emission level is shown in FIGS. 11A and 11B. FIG. 11a illustrates the vertical electric field strength, FIG. 11b being the horizontal electric field strength.

In FIG. 12; the vertical and horizontal components are analyzed with mean, standard deviation and correlation coefficient. As a result, it is noted that the GTEM result performed by the algorithm of the present invention has a very close correlation with the OATS.

As described above, the present invention can obtain a radiated emission value within a short time only with a GTEM cell, without actual measurement of the radiated emission in OATS over a long time. In addition, the present invention accomplishes more accurate estimated emission by considering the phase difference of the respective moment when the DUT is modeled with the dipoles, as compared with the conventional correlation algorithm.

Many different embodiments of the present invention may be constructed without departing from the spirit and scope of the invention. It should be understood that the present invention is not limited to the specific embodiments described in this specification. To the contrary, the present invention is intended to cover various modifications and equivalent arrangements included within the spirit and scope of the claims.

What is claimed:

1. A method for measuring radiated emission in order to obtain the correlation between a Giga-hertz Transverse ElectroMagnetic (GTEM) cell and an Open Area Test Site (OATS) which are facilities to measure the radiation emission generated from electronic products, said method for measuring radiated emission of the GTEM cell comprising the steps of:

(a) initializing the coordinate of Device Under Test (DUT) is the form (X-X', Y-Y', Z-Z'), which coincide the coordinates (X, Y, Z) of said GTEM cell with the coordinates (X', Y', Z') of the DUT, when the coordinates of the GTEM cell are set as (X, Y, Z) and the coordinates of the DUT are set as (X', Y', Z') and initializing the first and second measurement variables;

(b) increasing the first measurement variable by 1, and measuring the power of emission in accordance with the first measurement variable, and then comparing the first measurement variable with the second measurement variable initialized in said step (a);

(c) rotating the DUT counterclockwise by 45° and 90° with respect to axis Y according to the result of comparing in said step (b), and returning to said step (b);

(d) repeatedly performing said steps (b) and (c) within a range of predetermined threshold values, and correcting the spatial coordinates of the DUT;

(e) initializing a frequency used for measuring emission electric field strength, measuring the distance from center of low ground of DUT, maximum vertical electric field, maximum horizontal electric field, rotation angle of DUT and height of DUT;

(f) changing from the perpendicular coordinate having X, Y coordinates to the cylindrical coordinate having the rotation angle and height of DUT initialized in step (e), and calculating the maximum vertical/horizontal electric fields for the respective test frequency ranges, referring to changed cylindrical coordinates and GTEM transmission power data measured in said step (b);

(g) comparing the vertical electric field with the maximum vertical electric field calculated in said step (f); and comparing the horizontal electric field with maximum horizontal electric field calculated in said step (f);

(h) storing the vertical electric field as the maximum vertical electric field, and storing the horizontal electric field as the maximum horizontal electric field, if the vertical electric field and horizontal electric field are greater than the maximum vertical electric field and maximum horizontal electric field, respectively, and then repeating said steps (f) and (g) when the height of the DUT is a predetermined value;

(i) repeating the procedure from initializing the step height of the DUT as a predetermined value in said step (e) when the rotation angle of the DUT is set as a predetermined value, if the height of the DUT is the predetermined value in said step (h); and (j) outputting the maximum vertical electric field and the horizontal electric field stored in said step (h), and outputting the frequency initialized in said step (e) when the frequency is set as predetermined value, if the rotation angle set as predetermined value.

2. A method for measuring radiated emission for a GTEM cell as claimed in claim 1, wherein said step (c) comprises the sub-steps of:

rotating the DUT counterclockwise by 45° with respect to axis Y, if the first measurement variable is greater than the second measurement variable as a result of the comparing in said step (b), and returning said step (b);

comparing the first measurement variable to the first through third predetermined values respectively, if the first measurement variable is greater than the second measurement variable as a result of the comparing in said step (b); and rotating the DUT counterclockwise by 90° with respect to axis Y, if the first measurement variable is equal to the first through the third predetermined values as a result of the comparing in said comparing sub-step, and returning said rotation sub-step.

3. A method for measuring radiated emission for a GTEM cell as claimed in claim 1 or claim 3, wherein said step (d) comprises the sub-steps of:

changing the coordinates of the DUT from the form, (X-X', Y-Y', Z-Z') initialized in step (a) into the coordinate of the DUT in the form (X-Y', Y-Z', Z-X'), if the first measurement variable is equal to the first predetermined value as a result of the comparing in said comparing sub-step setting the second measurement variable as a value greater than first measurement variable n by 2, and then repeating the procedure of said steps (b) and (c); and changing the coordinates of the DUT from the form (X-Y', Y-Z', Z-X') changed in said changing sub-step into the coordinates of the DUT in the form (X-Z', Y-X, Z-Y'), if the first measurement variable is equal to the second predetermined value as the result of the comparing in said comparing sub-step, setting the second measurement variable as a value greater than the first measurement variable n by 2, and then repeating the procedure of said steps (b) and (c).

* * * * *